United States Patent
Villain et al.

(10) Patent No.: US 8,180,306 B2
(45) Date of Patent: May 15, 2012

(54) VSWR COMPENSATION CIRCUITS FOR RF TRANSMIT CHAIN

(75) Inventors: Frederic Francois Villain, Caen (FR); Benoit Feron, Verson (FR)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 13/054,798

(22) PCT Filed: Jul. 22, 2009

(86) PCT No.: PCT/IB2009/053191
§ 371 (c)(1),
(2), (4) Date: Jan. 19, 2011

(87) PCT Pub. No.: WO2010/010525
PCT Pub. Date: Jan. 28, 2010

(65) Prior Publication Data
US 2011/0130104 A1  Jun. 2, 2011

(30) Foreign Application Priority Data

Jul. 23, 2008 (EP) .................................. 08290720

(51) Int. Cl.
H04B 1/04 (2006.01)
H03G 3/10 (2006.01)
(52) U.S. Cl. ...................... 455/127.1; 455/120; 330/285
(58) Field of Classification Search ................. 455/120, 455/121, 123, 124, 127.1, 127.2; 330/278, 330/279, 285, 296, 297
See application file for complete search history.

(56) References Cited

U.S. PATENT DOCUMENTS

| | | | |
|---|---|---|---|
| 4,673,886 A * | 6/1987 | Bickley et al. | 330/298 |
| 2005/0227640 A1 | 10/2005 | Haque et al. | |
| 2006/0017538 A1 | 1/2006 | Magoon et al. | |
| 2007/0057728 A1 * | 3/2007 | Autti | 330/285 |
| 2007/0184793 A1 * | 8/2007 | Drogi et al. | 455/127.1 |
| 2008/0136512 A1 | 6/2008 | Dow et al. | |
| 2008/0211585 A1 * | 9/2008 | Karoui et al. | 330/298 |
| 2011/0086600 A1 * | 4/2011 | Muhammad | 455/120 |

OTHER PUBLICATIONS

Qiao,D. et al. "Antenna Impedance Mismatch Measurement and Correction for Adaptive CDMA Transceivers", 2005 MTT-S International Microwave Symposium, pp. 783-786 (Jun. 2005).
Carrara, F. et al., "A 3W 55% PAE CMOS PA With Closed-Loop 20:1 VSWR Protection", Digest of Technical Papers, 2007 IEEE Int'l. Solid-State Circuits Conf., paper 4.2, pp. 80, 81, 588 (2007).
International Search Report and Written Opinion for Int'l. Patent Appln. No. PCT/IB2009/053191 (Oct. 16, 2009).

* cited by examiner

Primary Examiner — Blane J Jackson

(57) ABSTRACT

The present invention provides a method and apparatus for compensating the output of a transmitter stage (50) of a communications system. A communications apparatus has a transmitter stage (50) providing a variable control voltage which varies the power of the transmitter stage. The impedance at the output of the transmitter stage. (50) varies as the power varies. A control generation circuit compares a reference voltage to the variable control voltage to produce a control signal (VvswrC). A compensated load (40) coupled to the output of the transmitter stage (50) has active component (s) whose' impedance varies in response to the control signal (VvsweC) so as to compensate for the impedance at the output of the transmitter stage (50).

13 Claims, 8 Drawing Sheets

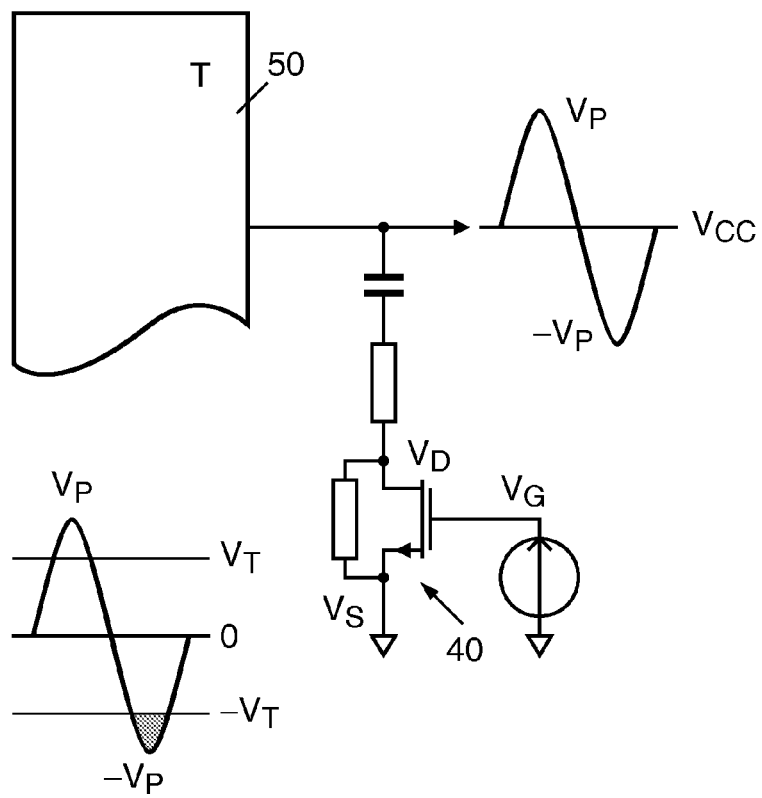
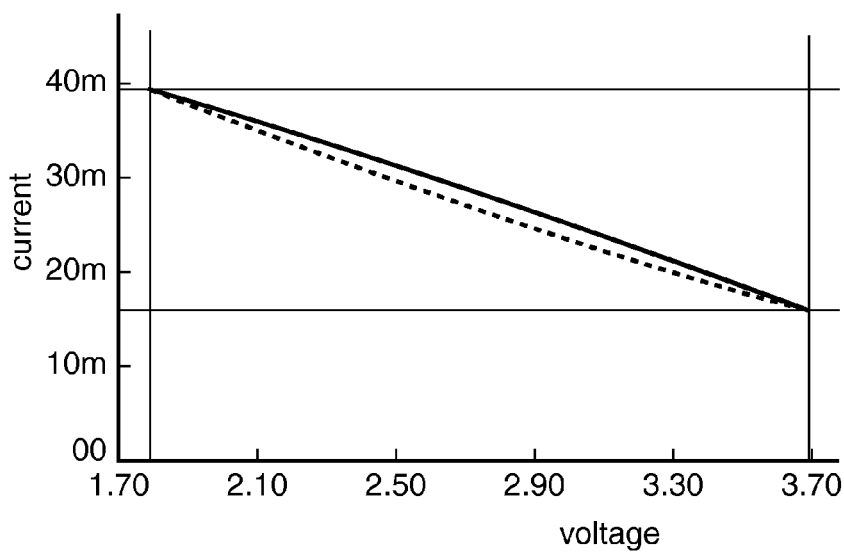
FIG. 8
FIG. 9

VSWR COMPENSATION CIRCUITS FOR RF TRANSMIT CHAIN

FIELD OF THE INVENTION

This invention relates generally relates to Radio Frequency (RF) Communication Systems. In particular, this invention related to circuitry in an RF transceiver which compensates for voltage standing waves.

BACKGROUND OF THE INVENTION

In communications systems, failure to match impedances causes unwanted standing waves resulting from signal reflection from a load. A voltage standing wave ratio (VSWR) is the ratio of the amplitude of a partial standing wave at an antinode (maximum) to the amplitude at an adjacent node (minimum), in an electrical transmission line. FIG. 1 illustrates stages of a communications system, including a variable gain amplifier (Tx), a SAW filter, and power amplifier (PA). The variable gain amplifier adoptively controls power output of a transmitted RF signal. The impedance at the output of the transmitter changes along with the voltage of the variable gain amplifier. FIG. 1 illustrates a situation where VSWR degradation occurs at the output of the transmitter and/or at the output of the power amplifier.

In order to obtain the maximum RF energy transfer between the transmitter (Tx) and the load, it is necessary that the impedance of the load match the output impedance of the transmitter or final RF amplifier. Generally, this load value is specified by the transmitter or amplifier manufacturer as being 50 ohms impedance, resistive, with j=0 where "j" is the notation for the value of reactance, either capacitive or inductive, and is expressed in ohms. This means that that the transmitter "wants" to be connected to a 50 ohms resistance, with no capacitive or inductive reactance. In theory, this is possible; in practice, it is nearly impossible, because all real components have some amount of inductance or capacitance—or both—in addition to their load resistance. If excessive inductive or capacitive reactance is present in the load, it may cause the amplifier to deliver less than its rated power; to draw excessive DC power; and, in some case, possibly overheat the PA amplifier to the point of destruction. The problem can become more complex when variable transmitter gain is necessary for the system communications such as, for example, in Wideband Code Division Multiple Access systems (W-CDMA). The majority of gain control is obtained through voltage gain amplifier parts, which can be built in common emitter configuration with bias current variation. The output network is set to present optimal impedance to the last BJT/CMOS stage in order to deliver maximum power with minimum Icq quiescent current.

A disadvantage of this variable gain amplifier (VGA) structure is that variation due to bias current control for variable gain purposes creates a mismatch at the output of the circuit (transmitter in this case). This variation which creates a high VSWR level, can disturb the rest of the transmitter chain. Particularly, the frequency response of the typical SAW filter used in such system, causes gain slope or phase change and may lead to the communication signal degradation. The last stage PA may face the same issue even without variable gain.

In view of the foregoing, there exists a need for an improved circuit and method for a VSWR compensation circuit at the output port of Variable Gain Amplifier. Without a compensation circuit, the transmit chain may create excessive ripple and may lead to poor communication channel measurements. Furthermore, in high dynamic output power system such as CDMA or W-CDMA, this kind of compensation circuit should be also able to handle high power peak signal without linearity degradation.

SUMMARY OF THE INVENTION

It is therefore an object of the invention to provide a load circuit for compensating the load at the output of a transmitter stage in order to compensate for variations of impedance. It is a further object of the present invention to provide a method and apparatus which enables VSWR compensation at the output of a variable gain amplifier which is able to handle high power peak signals without linearity degradation.

Accordingly, the present invention provides a method and apparatus for compensating the output of a transmitter stage of a communications system. A communications apparatus has a transmitter stage providing a variable control voltage which varies the power of the transmitter stage. The impedance at the output of the transmitter stage varies as the power varies. A control generation circuit compares a reference voltage to the variable control voltage to produce a control signal (a bias current or a bias voltage). A compensated load coupled to the output of the transmitter stage has active component(s) whose impedance varies in response to the control signal so as to compensate for the impedance at the output of the transmitter stage. The active component(s) includes bipolar junction transistors (BJT), field-effect transistors (FET), and combinations thereof. The invention is not limited to these transistor types and can include other transistor combinations.

BRIEF DESCRIPTION OF THE DRAWINGS

The objects, features and advantages of the present invention will be apparent to one skilled in the art in light of the following detailed description in which:

FIG. 8 shows a MOS circuit at high power levels.

FIG. 9 illustrates the DC shift load line according to the present invention.

DETAILED DESCRIPTION OF THE INVENTION

Figure 1:
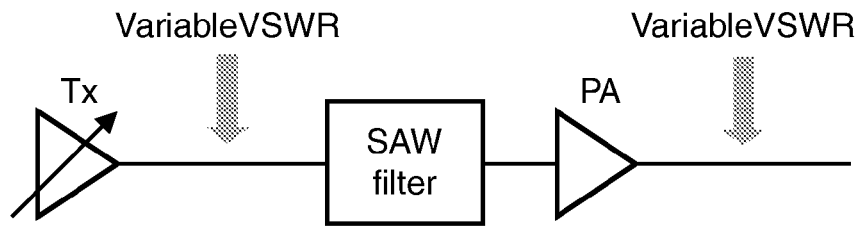
FIG. 1 is a diagram illustrating degradation due to a high VSWR.
Figure 2:
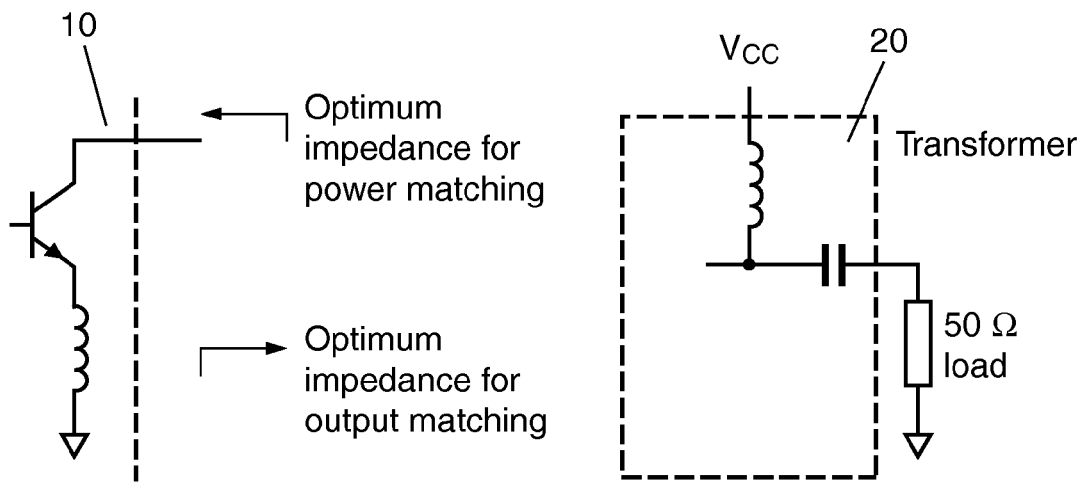
FIG. 2 is a diagram illustrating optimal impedance for both goals.

Referring to FIG. 2, an optimum impedance, allowing maximum voltage and current swing under minimum Icq current, has to be presented to the last stage BJT/FET device 10 of the transmitter or power amplifier (PA) through a determined impedance transformation. The output impedance of transformer 20 is to be matched by the impedance of the device 10. As an illustrated example, we will consider that the targeted impedance is 70Ω for the voltage gain amplifier (VGA) output device at the maximum output power. This impedance transformation (50Ω to 70Ω in the forward direction) is not dynamically controlled and is constant with control variation. Due to the transformer symmetry, a perfect match is obtained at the output port when 70Ω impedance is also presented in the reverse direction in the collector BJT-Drain FET plan.

Figure 3:
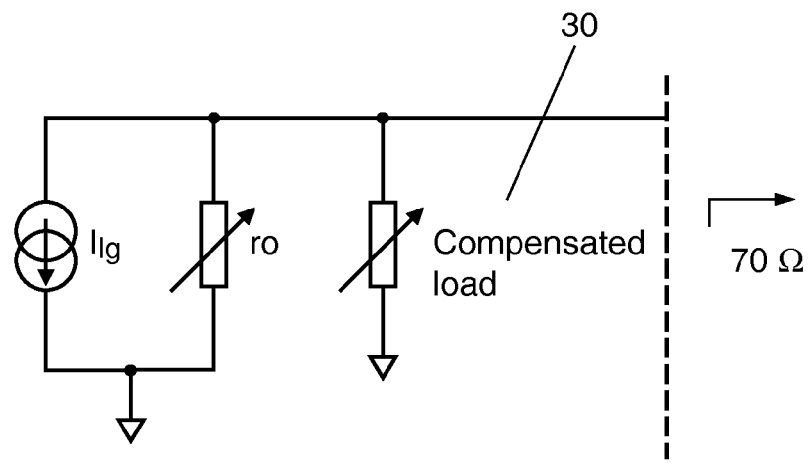
FIG. 3 is a diagram illustrating a compensated load.

Referring to FIG. 3, since the power control and RF VGA is based on variation of the Icq quiescent and the current collector bias variation, ro will increase when Icq is reduced, thus creating a mismatch through the LC transformer 20 and consequently, a poor return loss (RL) at the load port. An additional shunt resistor 30 is added according to the present invention to compensate this variation over power control keeping the combined parallel impedance nearly constant to 70Ω.

Control Generation

Figure 10:
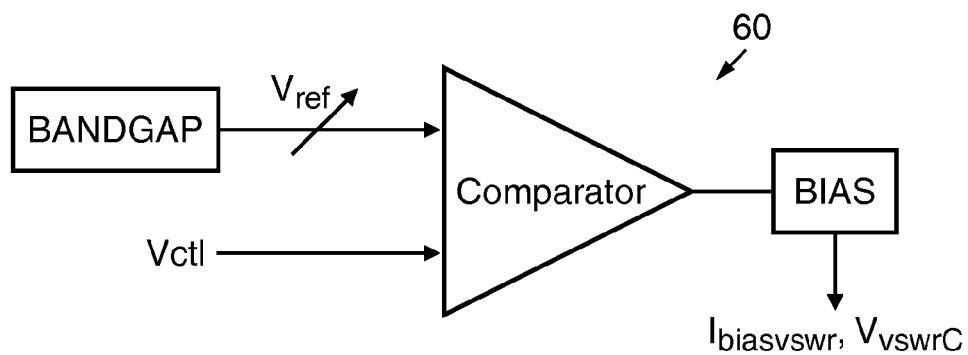
FIG. 10 illustrates control generation according to the present invention
Figure 11:
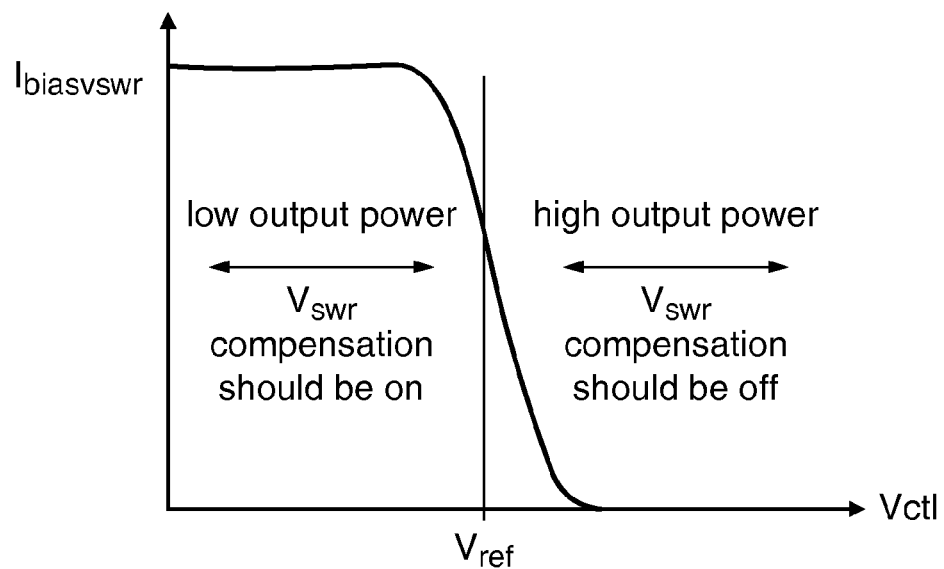
FIG. 11 illustrates the signal inputs and outputs of the control generation.

Referring to FIG. 10, there is shown a control generation circuit having as inputs the control voltage Vctl and a bandgap reference voltage Vref. The bandgap reference voltage is generated by the device BANDGAP and adjustably set to the reference voltage Vref. The control voltage Vctl comes from the automatic voltage gain control of the transmitter 50 (see FIG. 4). The control voltage Vctl and the reference voltage Vref are input into a comparator and the output of the comparator goes through a device BIAS which produces at its output either a control signal which is either a current bias Ibiasvswr or a voltage bias Vvswrc. For example, as shown in FIG. 11, the output of the comparator and bias circuit is the current Ibiasvswr which has a high signal which Vctl is less then Vref and a low signal which Vctl is higher then Vref.

Although FIG. 10 shows a control current, the Vctl that is the voltage control to adjust the output power will be used to generate either the gate voltage VvswrC (MOS type) or the biasing current Ibiasvswr (BJT type). The principle is the following: the bandgap reference voltage can be adjusted. This will fix the activation threshold level of the load compensation circuit, depending on how Vctl is used to control the output power of the transmitter stage 50.

BJT Compensated Load

Figure 4:
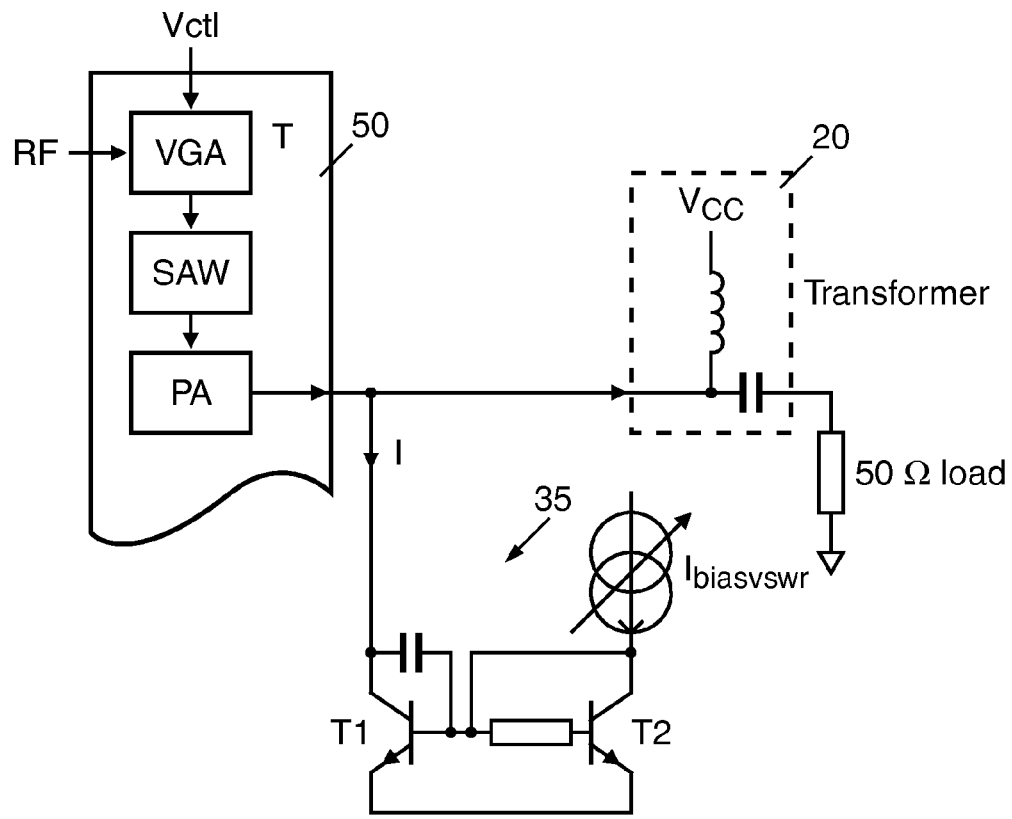
FIG. 4 is a diagram illustrating a BJT compensated load according to the present invention.

Referring to FIG. 4, an embodiment is shown of a transmitter stage 50 wherein a RF signal is amplified by a variable gain amplifier (VGA), filtered by a SAW filter, and amplified by a power amplifier (PA). A bipolar junction transistor (BJT) compensation load implementation circuit 35 is depicted as inserted between the transmitter stage 50 and the transformer circuit 20. The compensation load circuit 35 serves as the shunt resistance 30 (see FIG. 3). The transmitter 50 includes a circuit with an impedance Z and output current Ito be compensated by the impedance formed with compensation circuit 35. The compensation load circuit 35 comprises a common emitter transistor T1 and a transistor T2 connected at their emitters. Transistors T1 and T2 are chosen to have the same characteristics. The base of the transistor T1 is connected to the base of the transistor T2 through a resistor. The capacitor connecting the collector of T1 to the base of T1 is chosen to DC decouple the biasing circuitry.

Referring again to FIG. 4, the current Ibiasvswr is input to the collector of transistor T2. The bandgap reference voltage can be adjusted. This will fix the activation threshold level of the load compensation circuit, depending on how Vctl is used to the output of the transmitter stage 50.

Referring again to FIG. 4, the compensation load circuit comprising transistors T1 and T2 function together as a passive variable resistor. The transistors T1 and T2 are bipolar junction transistors (BJT) which have identical characteristics. The diode configuration allows changing the impedance by quiescent current variations.

The impedance is $Zvswr = VT/I$ where VT is the threshold voltage of transistor T1.

The current mirror Ibiasvswr is proportional to Vctl which is the voltage that controls the adjustment of the output power. With an Ibiasvswr current variation from 0 to 250 uA, the compensation load Zvswr will vary from high impedance to 100 ohms.

Figure 6:
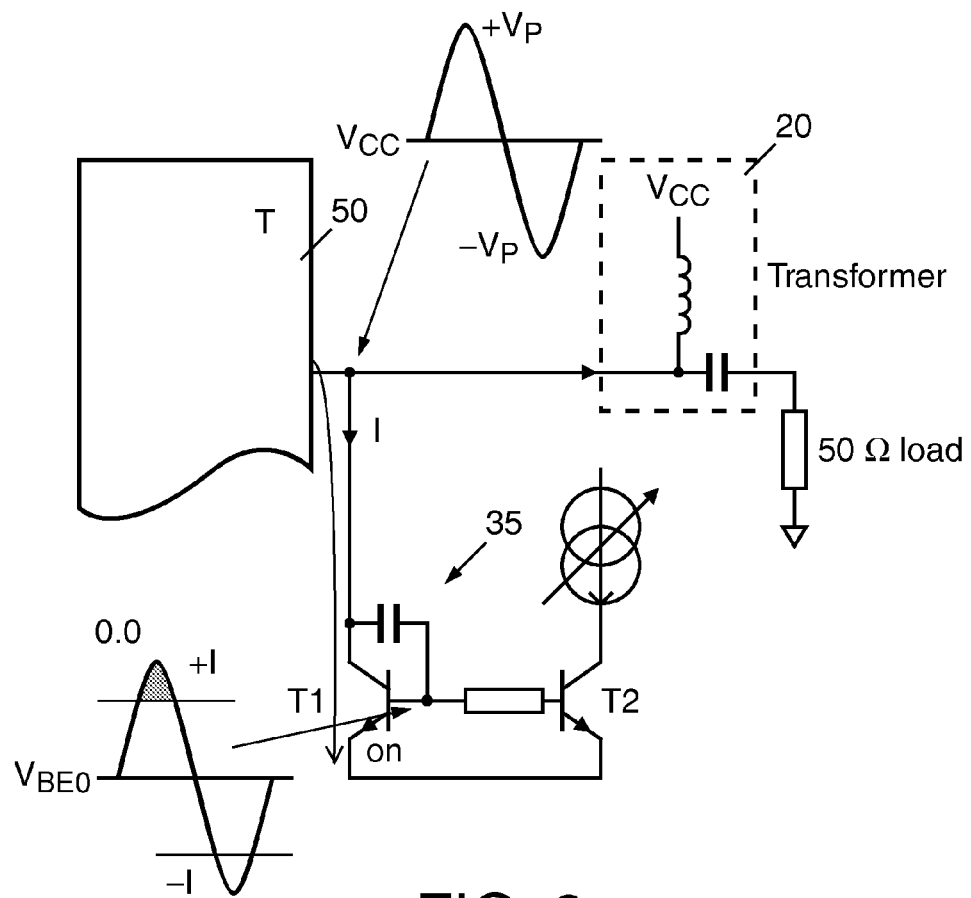
FIG. 6 illustrates the functioning of the circuit of FIG. 5 at high power levels.
Figure 7:
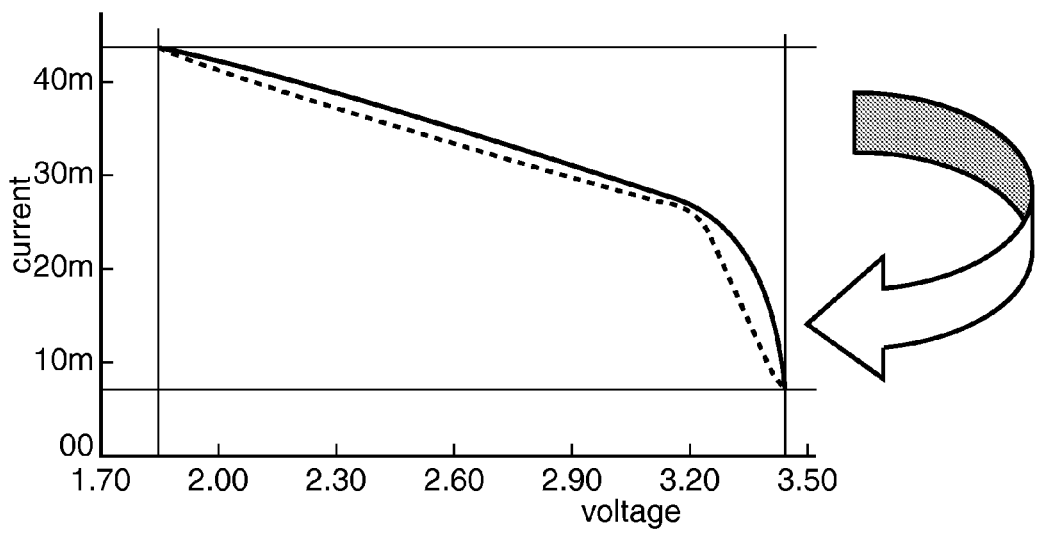
FIG. 7 shows the impact on the load line of degradation of the linearity at high power levels.

Referring to FIG. 6, there is shown the functioning of the load compensation circuit 35 for the situation of high output power. When large positive pulses occur, the base voltage of the BJT transistor is self-biased. VSWR compensation becomes an active circuit instead of passive impedance. FIG. 7 shows the strong linearity degradation when the output power is high.

MOS Version of Compensated Load

Figure 5:
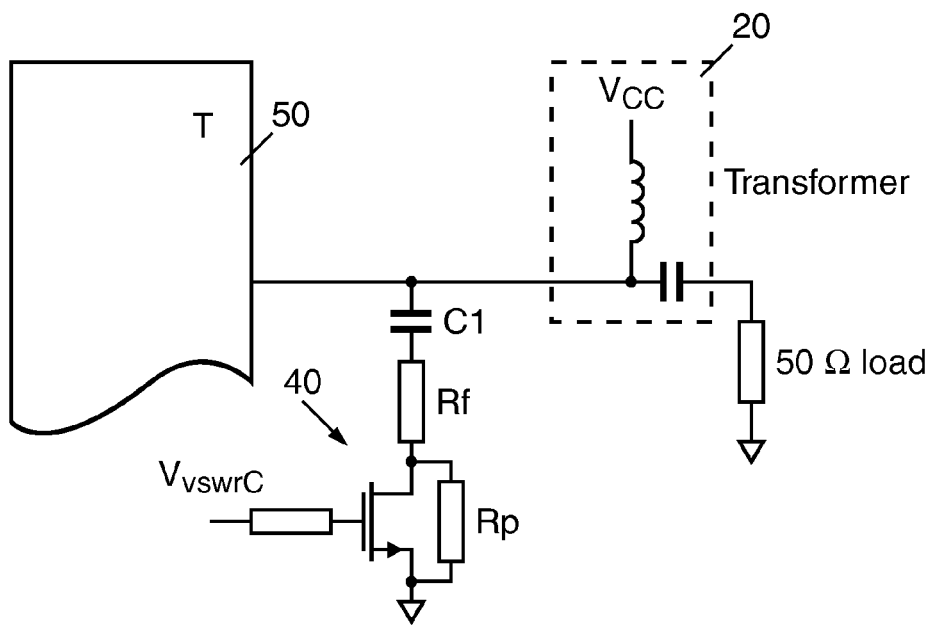
FIG. 5 illustrates a compensated load according to the present invention.

FIG. 5 shows an embodiment of a load compensation circuit 40 using an metal-oxide-semiconductor field-effect transistor (MOSFET) according to the present invention. The FET compensation load implementation circuit 40 is depicted as inserted between the transmitter stage 50 and the transformer circuit 20. The compensation load circuit 40 serves as the shunt resistance 30 (see FIG. 3).

The MOSFET 40 has a gate, a source, and a drain. The gate is coupled to output of the control generation circuit 60 which provides voltage Vvswrc. The drain of the MOSFET 40 is connect to the output transmitter stage 50 via the resistor Rf and capacitor C1 (parameter chosen to DC decouple the circuit). The source is connected to ground. The resistor Rp connects the drain to the source of the MOSFET 40.

Figure 13:
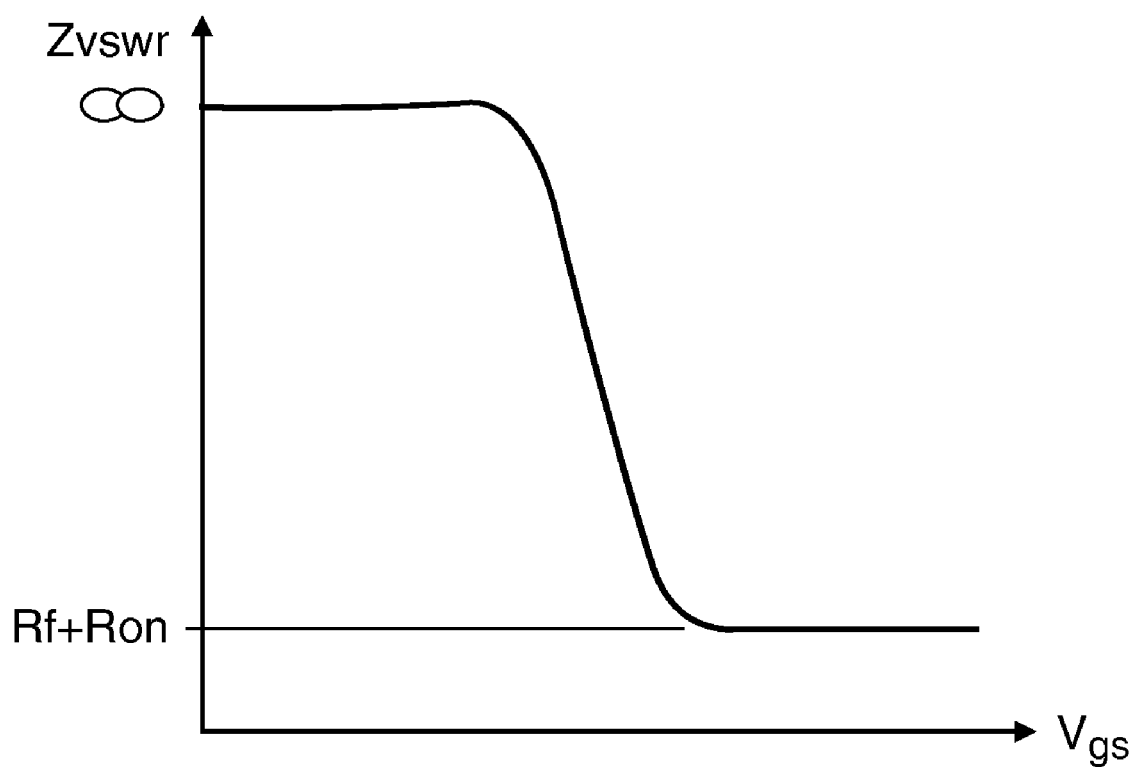
FIG. 13 shows how the impedance varies according to the present invention.

Referring further to FIG. 5, Rp is a high value resistor to keep Vds=0 V and Rf is chosen such as Rf+Ron=70, where Ron is the equivalent "ON" state resistance. The gate voltage control Vvswrc is inversely proportional to Vctl that is the voltage used to adjust the output power. The impedance can now be calculated:

$$Zvswr = \frac{1}{uCox(W/L) \cdot Vgt} + Rf + Ron \qquad \text{Equation 1}$$

where Cox is the gate oxide capacitance per unit area, W=the gate width L=gate length, Rf=the resistor connected to the source of the transistor, Ron=the equivalent "On" state resistance and Vgt=the voltage at the gate of the transistor which is set by Vvswrc. With VvswrC variation from 0 to 2.5V, the compensation load will vary from a high impedance to Rf+Ron ohms as shown in FIG. 13. The parameters of the transistor are as follows: $V_D = V_S = 0V$ and $V_{DD} > V_{GS} > 0$. When the power amplifier (PA) is on, the VSWR compensation is off. If the AC signal $V_p > V_T$, then the MOS transistor is turned ON, and non linearities occurs.

FIG. 8 shows the MOS circuit implementation 40 for load compensation at high input powers. The dummy load is based on a NMOS in "cold FET" mode acting as a variable resistor voltage gate control, Vds=0V. The MOS size (w/l=200/0.25) is chosen to not degrade the output power performance in "OFF" mode and to be able to handle voltage swing without self-biasing, which may induct more insertion loss of the matching network.

FET with DC Shift

Figure 12:
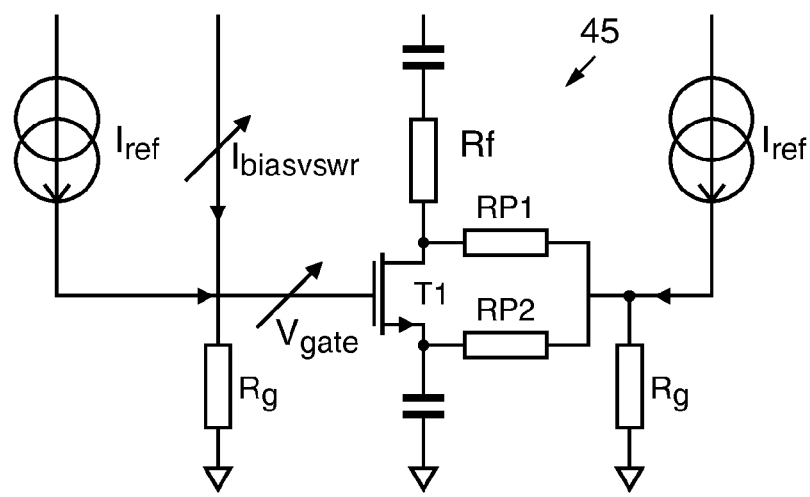
FIG. 12 shows a MOS load compensation circuit with DC shift according to the present invention.

With reference to FIG. 12, a load compensation circuit 45 with DC shift according to the present invention is described which solves the problems previously described of the linearity degradation at high RF power levels, by providing an output which does not degrade with RF power levels. The FET compensation load implementation circuit 45 is inserted between the transmitter stage 50 and the transformer circuit 20. The compensation load circuit 45 serves as the shunt resistance 30 (see FIG. 3). A resistance Rf connects the drain of transistor T1 to output of the transmitter stage through a capacitor which decouples the circuit from direct current. The two resistors Rg are for converting the currents to voltages. The variable current Ibiasvswr is translated to a variable voltage Vgate by the resistor Rg. The variable voltage Vgate controls the gate of transistor T1. The current Iref is presented at the input to the gate of T1 and a mirror Iref is presented to the drain of T1 through resistor RP1 and to the source of T1 through resistor RP2.

The DC shift concept is to shift the gate and the drain/source voltage of a transistor used as a variable passive impedance, in order to avoid the undesirable switch to an active state. When a transistor acts as a passive impedance, like in a VSWR compensation circuit, there are AC signals at its input. Up to a certain limit, the transistor stays passive but when large signals occurs, the DC shift will prevent the transistor from switching to an active state. Since a transistor used as passive impedance is usually on the AC signal path, the DC shift will keep signal integrity and will avoid harmonic distortion.

Iref is a current that is coming from a bandgap biasing circuitry and that is used to generate a DC shift at the transistor gate and at the source and the drain of a transistor used in "cold FET" mode. The DC shift concept only works if both ends of the transistor are shifted. This avoid the AC signal swinging around a 0V common mode (and consequently avoid the transistor going to active mode) but swinging around the DC shifted voltage.

The resistors RP1 and RP2 are equivalent to the resistor Rp (see FIG. 5) connecting the drain and source of the transistor T1. Thus Rp1 and Rp2 are high value resistors with resistance chosen to keep Vds=0 V. Rp is part of the VSWR concept. For the DC shift concept, Rp is split into two resistors in order to set the common mode voltage or DC shift. The impedance ZVSWR is the impedance of Equation 1.

Simulations Results

Figure 14:
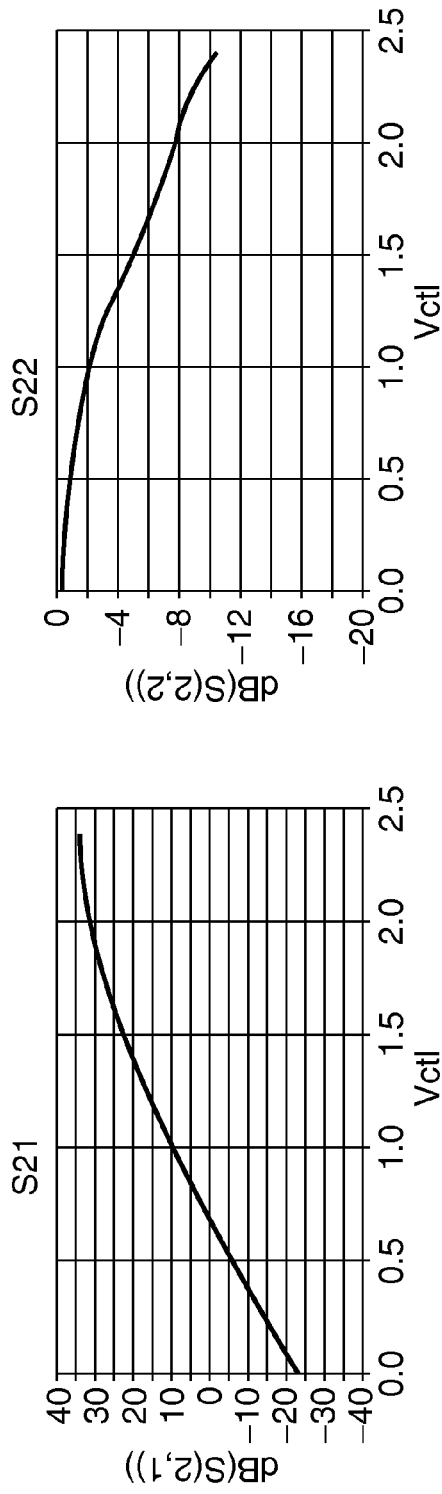
FIG. 14 shows gain and return loss without a compensated load for the S21 and S22 parameters.

The large signal S-Parameters have been simulated to evaluate output mismatch vs. Vctl (output power voltage control). Input power and bias current variation have been implemented to reflect real functional conditions of the VGA in the transmitter chain. FIG. 14 shows the simulation results without the compensated load. The return loss has a −5 dB average value for an output power between −6 to 0 dBm leading to excessive insertion loss and ripple with a classic SAW filter designed to 50Ω system.

Figure 15:
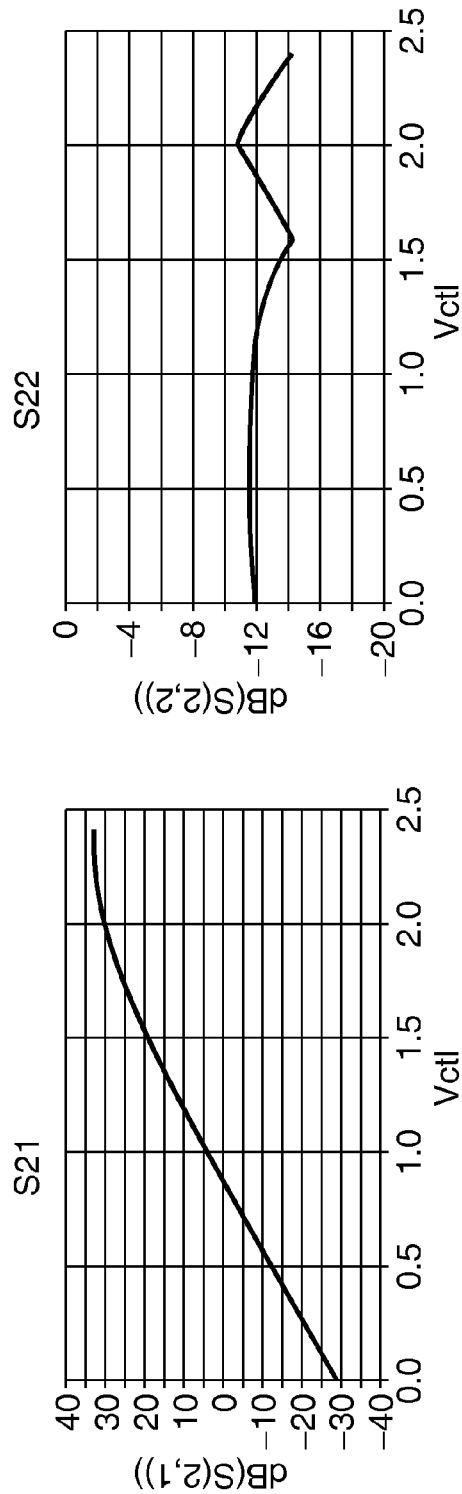
FIG. 15 shows gain and return loss with compensated load for the S21 and S22 parameters.

FIG. 15 shows the results with the return loss compensation scheme. The return loss S22 is drastically improved over the full Vctl range. The ripple in the return loss around 1.5 V is due to the complete "OFF" state on the NMOS. One may keep maintaining this impedance constant by limiting the gate voltage to 1 Volt but this will reduce the maximum output power.

Figure 16:
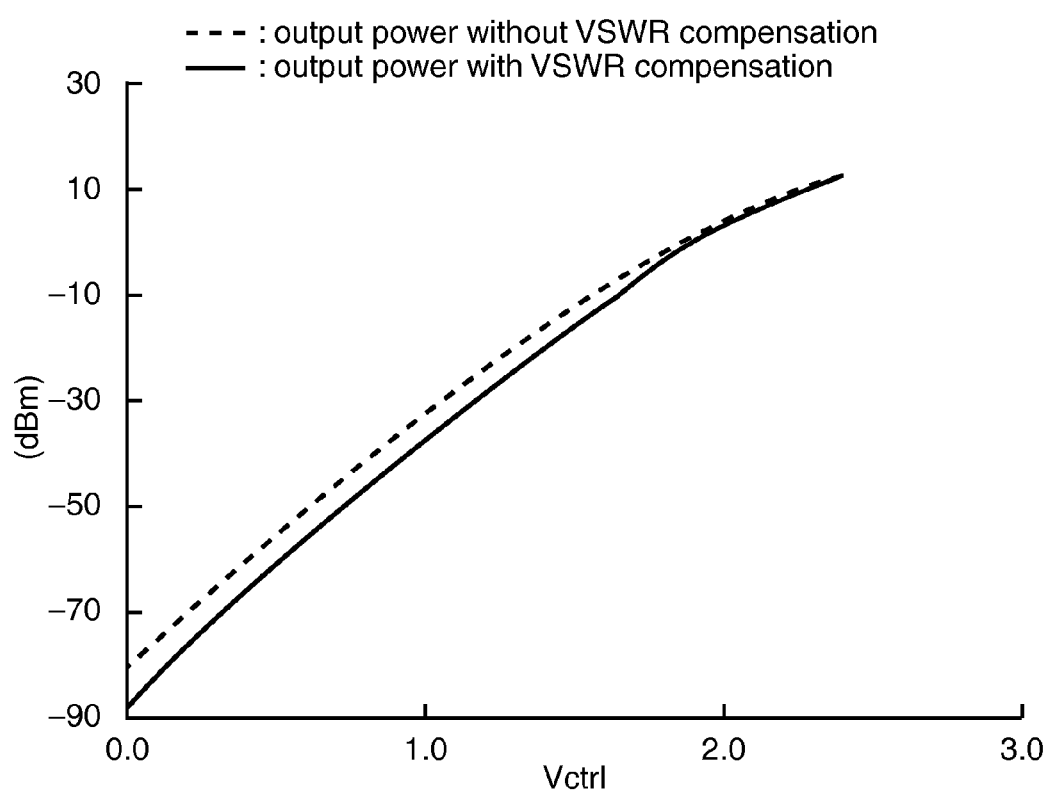
FIG. 16 shows output power vs. voltage control illustrating the benefit of VSWR compensation.

FIG. 16 shows the output power linearity vs. the voltage control. One can notice that the output power linearity is maintained with the compensated network load. The dynamic range is also increased as the variable resistor acts as an attenuator, reducing the minimum output power level.

A VSWR scheme has been implemented at the output of the voltage gain amplifier (VGA). Significant improvements have been demonstrated in the absolute value of output return loss under real circuit conditions. Another key benefice of the invention is the dynamic range improvement without drawbacks. Another improvement has been made in the linearity robustness versus output power. This will allow us the use of the invention with Tx WCDMA standards, which require higher peak to average ratios.

Although the invention has been described in conjunction with the preferred embodiment, it will be appreciated that various modifications and alterations might be made by those skilled in the art without departing from the spirit and scope of the invention. For example, embodiments have been illustrated using BJT and MOS transistors, however the invention can also use other transistor types as recognized by one of ordinary skill in the art.

The invention claimed is:

1. A communications apparatus having a transmitter stage providing a variable control voltage which varies a power of the transmitter stage, an impedance at an output of the transmitter stage varying as the power varies, comprising:
    a control generation circuit comparing a reference voltage to the variable control voltage to produce a control signal; and
    a compensated load coupled to the output of the transmitter stage having at least one active component whose impedance varies in response to the control signal so as to compensate for the impedance at the output of the transmitter stage.

2. The apparatus of claim 1, wherein the at least one active component comprises a field effect transistor (FET) having a gate, a source, and a drain, and the at least one active component further comprises:
    a bias circuit converting the control signal to a bias voltage;
    a resistor Rf coupling the output impedance of the transmitter to the drain of the FET; and
    a resistor Rp connecting the source of the FET to the drain of the FET to keep the transistor's drain to source voltage near zero; wherein
    the gate of the FET receives the bias voltage so as to vary the impedance of the compensated load as a function of the bias voltage.

3. The apparatus of claim 2, wherein the impedance of the compensated load is varied by choosing the value of Rf.

4. The apparatus of claim 2 wherein the impedance of the compensated load is proportional to Rf+Ron and inversely proportional to the bias voltage.

5. The apparatus of claim 2, wherein the impedance of the compensated load is varied by choosing the value of the reference voltage.

6. The apparatus of claim 2, further comprising a DC shift circuit having a shift current Iref input to the gate of the FET transistor and an identical current Iref input to the drain and the source of the FET through a first resistor and a second resistor so as to shift the voltage of the gate of the FET.

7. The apparatus of claim 1 wherein the at least one active component further comprises:

a bias circuit configured to convert the control signal into a bias current;
a BJT Transistor T1; and
a BJT Transistor T2,
wherein transistor T1 and T2 are coupled through their bases so as to form a passive impedance; and
wherein the bias current is input to the collector of the transistor T2 so that the bias current adjusts the impedance of the active component(s).

8. The apparatus of claim 7, wherein as the bias current varies from 0 to 250uA, the impedance of compensated load varies from a high impedance to 100 ohms.

9. The apparatus of claim 1, wherein the control voltage controls a variable gain amplifier.

10. A method for compensating an output impedance of a transmitter stage, the transmitter stage providing a variable control voltage which varies a power of the transmitter stage, the impedance at the output of the transmitter stage varying as the power varies, comprising the steps of:
 generating a control signal by comparing a reference voltage to the variable control voltage to produce a control signal; and
 compensating for the impedance at the output of the transmitter stage with a compensated load coupled to the output of the transmitter stage having at least one active component whose impedance varies in response to the control signal.

11. The method of claim 10, wherein the at least one active component comprises a field effect transistor (FET) having a gate, a source, and a drain, and the at least one active component further comprises a resistor Rf coupling the output impedance of the transmitter to the drain of the FET, a resistor Rp connecting the drain of the FET to the source of the FET to keep the transistor's drain to source voltage near zero, and the gate of the FET receives the control signal, comprising the steps of:
 converting by a bias circuit the control signal to a bias voltage; and
 adjusting the bias voltage so as to vary the impedance of the compensated load wherein the impedance of the compensated load is proportional to Rf+Ron and inversely proportional to the bias voltage.

12. The method of claim 11, further comprising providing a DC shift circuit having a shift current Iref input to the gate of the FET transistor and an identical current Iref input to the drain and the source of the FET through a first resistor and a second resistor, and shifting the voltage of the gate of the FET so that adjusting the bias voltage varies the impedance at the compensated load without the transistor becoming active at high voltages.

13. The method of claim 10 wherein the at least one active component further comprises:
 a bias circuit configured to convert the control signal into a bias current; a BJT Transistor T1; and a BJT Transistor T2, wherein transistor T1 and T2 are coupled through their bases so as to form a passive impedance; and wherein the bias current is input to the collector of the transistor T2 so that the bias current adjusts the impedance of the active component(s), further comprising the step of:
 adjusting the bias current so as to vary the load compensation as a function of the bias current.

* * * * *